United States Patent
Iwashita et al.

(10) Patent No.: US 10,872,764 B2
(45) Date of Patent: Dec. 22, 2020

(54) FILM FORMING METHOD (71) Applicant: Tokyo Electron Limited, Tokyo (JP)

(72) Inventors: Shinya Iwashita, Yamanashi (JP); Takamichi Kikuchi, Yamanashi (JP); Naotaka Noro, Yamanashi (JP); Toshio Hasegawa, Yamanashi (JP); Tsuyoshi Moriya, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 130 days.

(21) Appl. No.: 16/132,729

(22) Filed: Sep. 17, 2018

(65) Prior Publication Data
US 2019/0088475 A1 Mar. 21, 2019

(30) Foreign Application Priority Data
Sep. 19, 2017 (JP) .................... 2017-179464

(51) Int. Cl.
| | |
|---|---|
| *H01L 21/02* | (2006.01) |
| *C23C 16/40* | (2006.01) |
| *C23C 16/455* | (2006.01) |
| *C23C 16/26* | (2006.01) |
| *C23C 16/52* | (2006.01) |

(52) U.S. Cl.
CPC ........ *H01L 21/02274* (2013.01); *C23C 16/26* (2013.01); *C23C 16/405* (2013.01); *C23C 16/4554* (2013.01); *C23C 16/45527* (2013.01); *C23C 16/45542* (2013.01); *C23C 16/52* (2013.01); *H01L 21/022* (2013.01); *H01L 21/0228* (2013.01); *H01L 21/02186* (2013.01); *H01L 21/02205* (2013.01)

(58) Field of Classification Search
CPC ............. H01L 21/02274; H01L 21/022; H01L 21/02186; H01L 21/0228; H01L 21/02205; C23C 16/52; C23C 16/45527; C23C 16/4554; C23C 16/26; C23C 16/45542; C23C 16/405
See application file for complete search history.

(56) References Cited

U.S. PATENT DOCUMENTS

| | | | |
|---|---|---|---|
| 2006/0088660 A1* | 4/2006 | Putkonen .......... | C23C 16/45531 427/248.1 |
| 2007/0026540 A1* | 2/2007 | Nooten ............. | H01L 29/66181 438/5 |
| 2016/0240367 A1* | 8/2016 | Kimura ............. | H01L 21/02219 |
| 2016/0372324 A1* | 12/2016 | Kao .................. | H01L 21/02274 |

FOREIGN PATENT DOCUMENTS

| | | |
|---|---|---|
| JP | 2014-187104 A | 10/2014 |
| JP | 2015-111668 A | 6/2015 |
| JP | 2016-189432 A | 11/2016 |
| KR | 10-2009-0089265 A | 8/2009 |

* cited by examiner

Primary Examiner — John P. Dulka
(74) Attorney, Agent, or Firm — Abelman, Frayne & Schwab (57) ABSTRACT

Disclosed is a film forming method including forming a metal oxide film on a base film by alternately supplying a metal-containing gas and a plasmatized oxidizing gas. The metal-containing gas is changed from a first metal-containing gas having no halogen to a second metal-containing gas different from the first metal-containing gas during the film forming of the metal oxide film.

8 Claims, 8 Drawing Sheets

| FILM CONFIGURATION | TiCl$_4$ 15nm | TDMAT 1nm + TiCl$_4$ 14nm | TDMAT 3nm + TiCl$_4$ 12nm | TDMAT 5nm + TiCl$_4$ 10nm | TDMAT 15nm |
|---|---|---|---|---|---|
| SEM PHOTOGRAPH OR STEM PHOTOGRAPH | BASE FILM (AMORPHOUS CARBON FILM) / METAL OXIDE FILM (TiO2 FILM) | | | | |
| ENLARGED VIEW | | | | | |

| FILM CONFIGURATION | TiCl₄ 15nm | TDMAT 1nm + TiCl₄ 14nm | TDMAT 3nm + TiCl₄ 12nm |
|---|---|---|---|
| SEM PHOTOGRAPH | BASE FILM(AMORPHOUS-CARBON FILM) / METAL OXIDE FILM (TiO₂ FILM) STEM | STEM | STEM |

| IMPEDANCE | 0 Ω | 292 Ω |
|---|---|---|
| STEM PHOTOGRAPH | METAL OXIDE FILM (TiO₂ FILM) / BASE FILM(AMORPHOUS CARBON FILM) | |

FILM FORMING METHOD

CROSS-REFERENCE TO RELATED APPLICATIONS

This application is based on and claims priority from Japanese Patent Application No. 2017-179464 filed on Sep. 19, 2017 with the Japan Patent Office, the disclosure of which is incorporated herein in its entirety by reference.

TECHNICAL FIELD

The present disclosure relates to a film forming method.

BACKGROUND

In a plasma enhanced atomic layer deposition (PEALD) method using a capacitively coupled plasma processing apparatus, reduction in damage to a base film due to discharge is a problem.

As a technology to reduce damage to the base film due to discharge, a technology that grows a thin titanium oxide film with low plasma power and subsequently grows a conformal titanium oxide film with high plasma power is known (see, e.g., Japanese Patent Laid-Open Publication No. 2015-111668).

SUMMARY

A film forming method according to an aspect of the present disclosure is a film forming method including forming a metal oxide film on a base film by alternately supplying a metal-containing gas and a plasmatized oxidizing gas, in which the metal-containing gas is changed from a first metal-containing gas having no halogen to a second metal-containing gas different from the first metal-containing gas during the film forming of the metal oxide film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the related art, the range of available plasma power is limited. Therefore, it is difficult to form a film having a desired film quality in some cases.

In view of the above, in an aspect of the present disclosure, it is an object to provide a film forming method having high film quality controllability and capable of reducing damage to a base film.

To achieve the object described above, a film forming method according to an aspect of the present disclosure is a film forming method including forming a metal oxide film on a base film by alternately supplying a metal-containing gas and a plasmatized oxidizing gas, in which the metal-containing gas is changed from a first metal-containing gas having no halogen to a second metal-containing gas different from the first metal-containing gas during the film forming of the metal oxide film.

In the above-described film forming method, the metal oxide film formed using the first metal-containing gas has a thickness of 1 nm or less.

In the above-described film forming method, the halogen is chlorine.

In the above-described film forming method, the first metal-containing gas and the second metal-containing gas contain same metal.

In the above-described film forming method, the first metal-containing gas is tetrakis(dimethylamino)titanium (TDMAT).

In the above-described film forming method, the second metal-containing gas is $TiCl_4$.

In the above-described film forming method, the base film is an amorphous carbon film having a predetermined pattern.

A film forming method according to another aspect of the present disclosure is a film forming method including forming a metal oxide film on a workpiece by alternately supplying a metal-containing gas and a plasmatized oxidizing gas using a film forming apparatus including a placing table on which the workpiece is placed and an impedance adjustment circuit provided to adjust an impedance between the placing table and a ground. The impedance adjustment circuit is adjusted such that the impedance changes from a first impedance to a second impedance lower than the first impedance during film formation of the metal oxide film According to an aspect of the present disclosure, it is possible to provide a film forming method having high film quality controllability and capable of reducing damage to a base film.

Hereinafter, modes for carrying out the present disclosure will be described with reference to the accompanying drawings. In addition, in this specification and the drawings, substantially the same components will be denoted by the same reference numerals, and a redundant description thereof will be omitted.

First Embodiment (Film Forming Apparatus)

Figure 1:
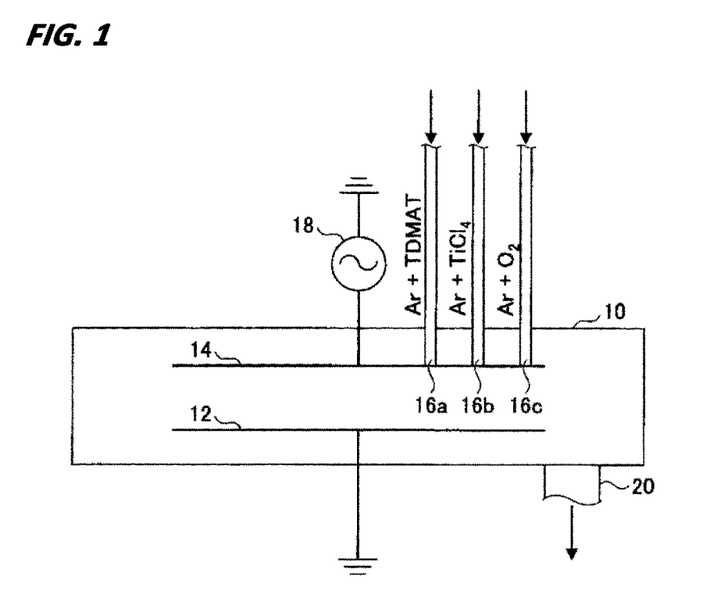
FIG. 1 is a schematic diagram illustrating an exemplary film forming apparatus that carries out a film forming method of a first embodiment.

An exemplary film forming apparatus that carries out a film forming method of a first embodiment will be described. FIG. 1 is a schematic diagram illustrating an exemplary film forming apparatus that carries out a film forming method of a first embodiment.

As illustrated in FIG. 1, the film forming apparatus of the first embodiment is configured as a capacitively coupled type (parallel plate type) plasma film forming apparatus. The film forming apparatus includes a substantially cylindrical processing container 10.

The processing container 10 is formed of, for example, aluminum of which the surface is anodized. The processing container 10 is grounded. A placing table 12 is provided inside the processing container 10.

The placing table 12 is grounded, supports a semiconductor wafer (hereinafter referred to as "wafer W") as an exemplary workpiece placed thereon, and also functions as a lower electrode. A shower head 14 is provided above the placing table 12 so as to face the placing table 12 in parallel.

The shower head 14 supplies a gas into the processing container 10, and also functions as an upper electrode. A plurality of gas supply units 16a, 16b, and 16c and a high frequency power supply 18 are connected to the shower head 14.

The gas supply unit 16a introduces a first metal-containing gas and argon (Ar) gas into the shower head 14. The first metal-containing gas is a metal-containing gas having no halogen (e.g., chlorine) such as, for example, tetrakis(dimethylamino)titanium (TDMAT).

The gas supply unit 16b introduces a second metal-containing gas and Ar gas into the shower head 14. The second metal-containing gas is a metal-containing gas different from the first metal-containing gas, and may include halogen or may not include halogen. The second metal-containing gas may be, for example, titanium chloride ($TiCl_4$).

The gas supply unit 16c introduces an oxidizing gas and Ar gas into the shower head 14. The oxidizing gas is, for example, oxygen ($O_2$) gas.

The gas introduced from the gas supply units 16a, 16b, and 16c into the shower head 14 is discharged into the processing container 10 through a number of gas holes (not illustrated) formed in the lower surface of the shower head 14.

The high frequency power supply 18 is a power supply for exciting plasma, and applies high frequency power to the shower head 14. The frequency of the high frequency power may be set to a frequency suitable for generating plasma in the processing container 10, for example, 380 kHz to 60 MHz.

An exhaust port 20 is provided in the bottom portion of the processing container 10, and exhausts the gas supplied from the shower head 14 into the processing container 10.

When a plasma processing is performed in this film forming apparatus, the wafer W is placed on the placing table 12. In addition, a gas is supplied into the processing container 10 from the plurality of gas supply units 16a, 16b, and 16c, and the pressure inside the processing container 10 is reduced by the exhaust port 20. Then, the gas supplied into the processing container 10 is excited by the high frequency power applied from the high frequency power supply 18 to the shower head 14. Thus, plasma is generated in the processing container 10, and the wafer W is processed by radicals and/or ions from the plasma.

(Film Forming Method)

Figure 2:
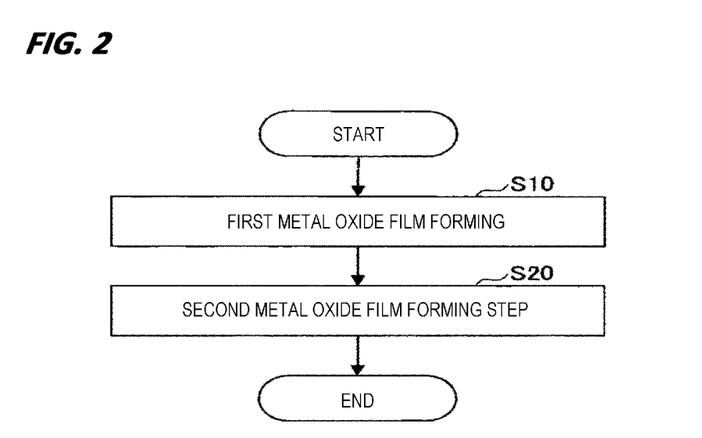
FIG. 2 is a flowchart for explaining the film forming method of the first embodiment.

Next, as for the film forming method of the first embodiment, descriptions will be made on a case where a titanium oxide ($TiO_2$) film as an exemplary metal oxide film is formed on a base film having a predetermined pattern formed on the wafer W using the above-described film forming apparatus by way of example. FIG. 2 is a flowchart for explaining the film forming method of the first embodiment.

As illustrated in FIG. 2, the film forming method of the first embodiment includes a first metal oxide film forming step S10 and a second metal oxide film forming step S20. The first metal oxide film forming step S10 is a step of forming a first metal oxide film on a base film by alternately supplying a first metal-containing gas having no halogen and a plasmatized oxidizing gas. The second metal oxide film forming step S20 is a step of forming a second metal oxide film on the first metal oxide film by alternately supplying a second metal-containing gas and a plasmatized oxidizing gas.

Figure 3:
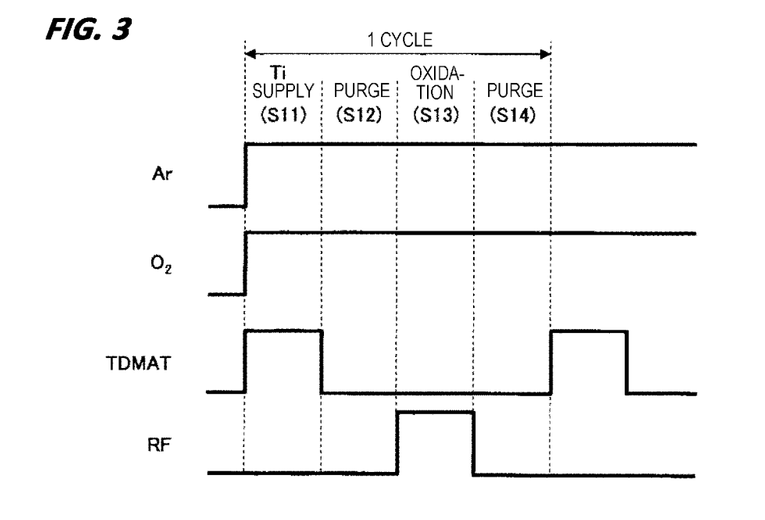
FIG. 3 is a diagram for explaining a first metal oxide film forming step.

FIG. 3 is a diagram for explaining the first metal oxide film forming step S10. As illustrated in FIG. 3, in the first metal oxide film forming step S10, a series of operations including an adsorption step S11, a purge step S12, an oxidation step S13, and a purge step S14 are defined as one cycle, and the number of cycles is controlled so as to form a $TiO_2$ film having a desired film thickness.

The adsorption step S11 is a step of supplying the first metal-containing gas into the processing container 10 and adsorbing the first metal-containing gas on the base film. In the adsorption step S11, TDMAT as an example of the first metal-containing gas, and Ar gas are supplied from the gas supply unit 16a into the processing container 10, and $O_2$ gas and Ar gas are supplied from the gas supply unit 16c. Thus, the TDMAT is adsorbed on the base film. The adsorption step S11 may be set to, for example, 0.05 seconds to 0.8 seconds.

The purge step S12 is a step of purging the excessive first metal-containing gas in the processing container 10. In the purge step S12, the supply of TDMAT from the gas supply unit 16a is stopped while the supply of $O_2$ gas and Ar gas from the gas supply unit 16c is continued. Thus, for example, the excessive TDMAT in the processing container 10 is purged. The purge step S12 may be set to, for example, 0.3 seconds to 1.0 second.

The oxidation step S13 is a step of supplying the oxidizing gas into the processing container 10 and oxidizing the TDMAT adsorbed on the base film. In the oxidation step S13, high frequency power (e.g., 13.56 MHz) is applied to the shower head 14 by the high frequency power supply 18 while the supply of $O_2$ gas and Ar gas from the gas supply unit 16c is continued. Thus, plasma of $O_2$ gas and Ar gas is generated, and the TDMAT adsorbed on the base film is oxidized. The oxidation step S13 may be set to, for example, 0.3 seconds to 0.4 seconds.

The purge step S14 is a step of purging, for example, the excessive plasmatized $O_2$ gas and Ar gas in the processing container 10. In the purge step S14, the high frequency power applied to the shower head 14 from the high frequency power supply 18 is interrupted while the supply of $O_2$ gas and Ar gas from the gas supply unit 16c is continued. Thus, the excessive plasmatized $O_2$ gas and Ar gas in the processing container 10 are purged. The purge step S14 may be set to, for example, 0.1 seconds to 0.2 seconds.

In this manner, by defining a series of operations including the adsorption step S11, the purge step S12, the oxidation step S13, and the purge step S14 as one cycle and controlling the number of cycles, a $TiO_2$ film having a desired film thickness (e.g., 1 nm) may be formed.

Figure 4:
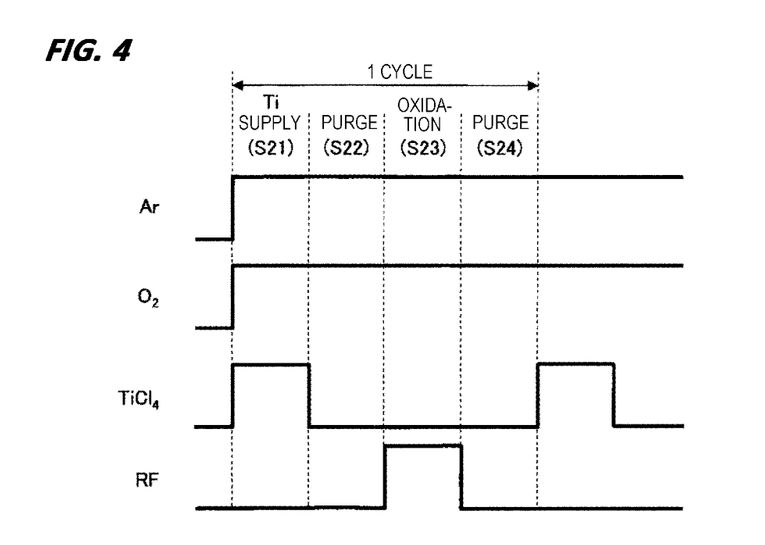
FIG. 4 is a diagram for explaining a second metal oxide film forming step.

FIG. 4 is a diagram for explaining the second metal oxide film forming step S20. As illustrated in FIG. 4, in the second metal oxide film forming step S20, a series of operations including an adsorption step S21, a purge step S22, an oxidation step S23, and a purge step S24 are defined as one cycle, and the number of cycles is controlled so as to form a $TiO_2$ film having a desired film thickness.

The adsorption step S21 is a step of supplying the second metal-containing gas into the processing container 10 and adsorbing the second metal-containing gas on the first metal oxide film. In the adsorption step S21, $TiCl_4$ as an example of the second metal-containing gas and Ar gas are supplied from the gas supply unit 16b into the processing container 10, and $O_2$ gas and Ar gas are supplied from the gas supply unit 16c. Thus, the $TiCl_4$ is adsorbed on the $TiO_2$ film as the first metal oxide film. The adsorption step S21 may be set to, for example, 0.05 seconds to 0.5 seconds.

The purge step S22 is a step of purging the excessive second metal-containing gas in the processing container 10. In the purge step S22, the supply of $TiCl_4$ from the gas supply unit 16b is stopped while the supply of $O_2$ gas and Ar gas from the gas supply unit 16c is continued. Thus, for example, the excessive $TiCl_4$ in the processing container 10 is purged. The purge step S22 may be set to, for example, 0.3 seconds to 1.0 second.

The oxidation step S23 is a step of supplying the oxidizing gas into the processing container 10 and oxidizing the $TiCl_4$ adsorbed on the first metal oxide film. In the oxidation step S23, high frequency power (e.g., 13.56 MHz) is applied to the shower head 14 by the high frequency power supply 18 while the supply of $O_2$ gas and Ar gas from the gas supply unit 16c is continued. Thus, plasma of $O_2$ gas and Ar gas is generated, and the $TiCl_4$ adsorbed on the first metal oxide film is oxidized. The oxidation step S23 may be set to, for example, 0.3 seconds to 1.0 second.

The purge step S24 is a step of purging, for example, the excessive plasmatized $O_2$ gas and Ar gas in the processing container 10. In the purge step S24, the high frequency power applied to the shower head 14 from the high frequency power supply 18 is interrupted while the supply of $O_2$ gas and Ar gas from the gas supply unit 16c is continued. Thus, the excessive plasmatized $O_2$ gas and Ar gas in the processing container 10 are purged. The purge step S24 may be set to, for example, 0.1 seconds to 1.0 second.

In this manner, by defining a series of operations including the adsorption step S21, the purge step S22, the oxidation step S23, and the purge step S24 as one cycle, and controlling the number of cycles, a $TiO_2$ film having a desired film thickness (e.g., 14 nm) may be formed.

Figure 5:
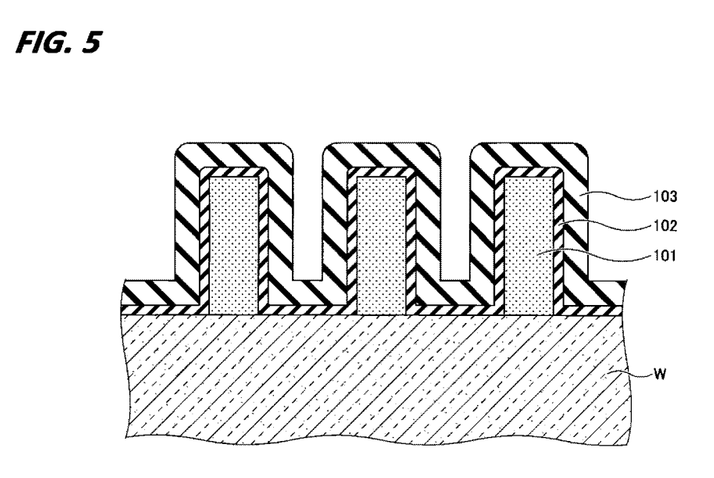
FIG. 5 is a schematic cross-sectional view of a metal oxide film formed by the film forming method illustrated in FIG. 2.

FIG. 5 is a schematic cross-sectional view of a metal oxide film formed by the film forming method illustrated in FIG. 2. As illustrated in FIG. 5, according to the film forming method of the first embodiment, by the first metal oxide film forming step S10, a $TiO_2$ film 102 as the first metal oxide film is formed so as to cover a base film 101 having a predetermined pattern formed on the wafer W. In addition, by the second metal oxide film forming step S20, a $TiO_2$ film 103 as the second metal oxide film is formed so as to cover the $TiO_2$ film 102.

As described above, according to the film forming method of the first embodiment, first, a $TiO_2$ film is formed on an amorphous carbon film using TDMAT having no halogen as a metal-containing gas. Subsequently, a $TiO_2$ film is formed by changing the metal-containing gas from TDMAT to $TiCl_4$. This makes it possible to prevent the surface of the amorphous carbon film from being corroded by halogen and being roughened at the initial stage of film formation in which the surface of the amorphous carbon film as a base film is exposed. That is, damage to the amorphous carbon film may be reduced.

In addition, when a $TiO_2$ film is formed using $TiCl_4$, the surface of the amorphous carbon film is covered with the $TiO_2$ film formed using TDMAT. Therefore, when $TiCl_4$ is supplied, halogen does not reach the surface of the amorphous carbon film, and the surface of the amorphous carbon film is not corroded by halogen. Thus, as a metal-containing gas used from the middle of film formation, various kinds of gases including $TiCl_4$ as a metal-containing gas including halogen may be used. As a result, it is possible to easily form a metal oxide film having a desired film quality (e.g., film density, wet etching rate, or dry etching rate). That is, high film quality controllability is obtained.

Example 1

In Example 1, an effect imparted to an amorphous carbon film when a $TiO_2$ film as a metal oxide film is formed through a PEALD method on the amorphous carbon film as a base film having a predetermined pattern was evaluated by observing a cross-sectional shape of the amorphous carbon film. In addition, in Example 1, the $TiO_2$ film was formed through the PEALD method in the processing container 10 adjusted to 0.5 Torr (67 Pa). In addition, in the oxidation step, high frequency power of 13.56 MHz was applied from a high frequency power supply. In addition, the cross-sectional shape was observed using a scanning electron microscope (SEM) and a scanning transmission electron microscope (STEM).

Figure 6:
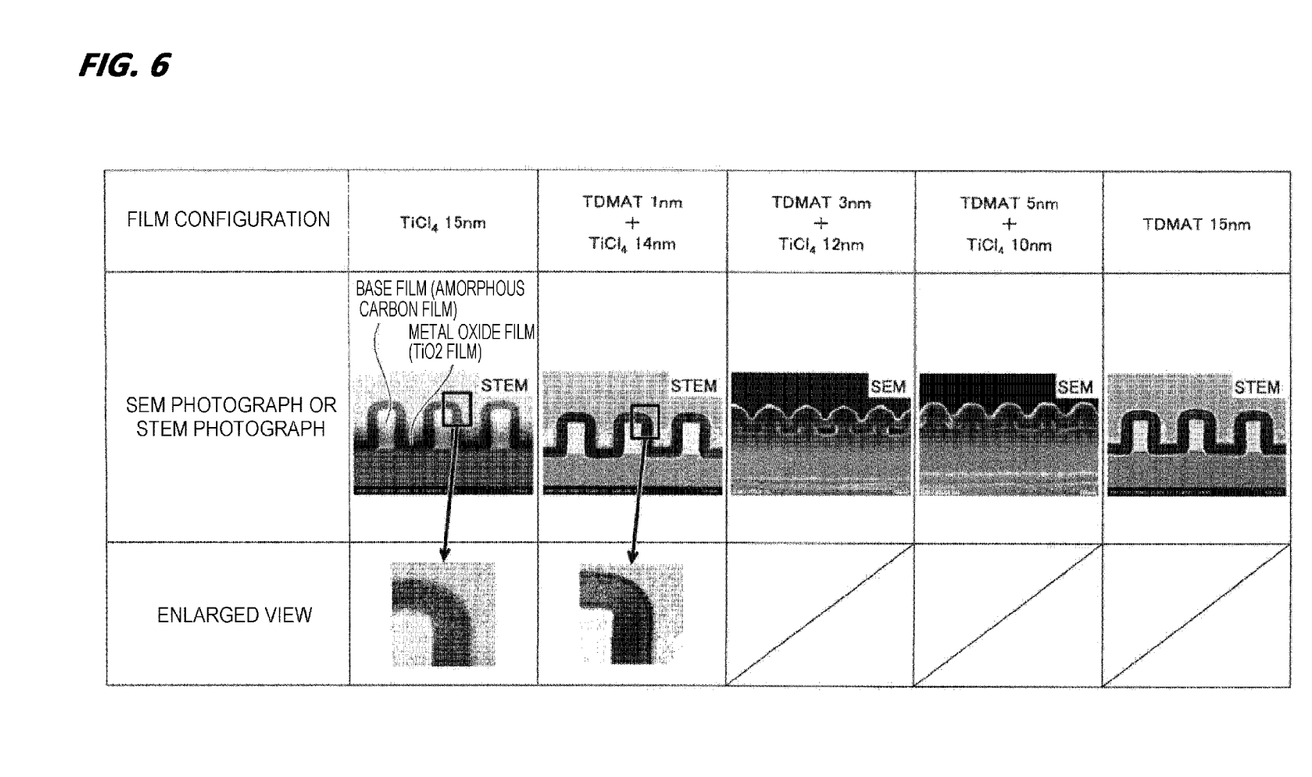
FIG. 6 is a diagram illustrating a cross-sectional shape of a metal oxide film formed by a film forming method in Example 1.

FIG. 6 is a diagram illustrating a cross-sectional shape of a metal oxide film formed by a film forming method in Example 1. The leftmost diagram in FIG. 6 is a STEM photograph when a $TiO_2$ film having a thickness of 15 nm was formed using $TiCl_4$ as a metal-containing gas. The second diagram from the left side is a STEM photograph when a $TiO_2$ film having a thickness of 1 nm was formed using TDMAT as a metal-containing gas, and thereafter a $TiO_2$ film having a thickness of 14 nm was formed using $TiCl_4$ as a metal-containing gas. The third diagram from the left side is a STEM photograph when a $TiO_2$ film having a thickness of 3 nm was formed using TDMAT as a metal-containing gas, and thereafter a $TiO_2$ film having a thickness of 12 nm was formed using $TiCl_4$ as a metal-containing gas. The fourth diagram from the left side is a STEM photograph when a $TiO_2$ film having a thickness of 5 nm was formed using TDMAT as a metal-containing gas, and thereafter a $TiO_2$ film having a thickness of 10 nm was formed using $TiCl_4$ as a metal-containing gas. The rightmost diagram is a STEM photograph when a $TiO_2$ film having a thickness of 15 nm was formed using TDMAT as a metal-containing gas.

As illustrated in FIG. 6, when forming the TiO$_2$ film having a thickness of 15 nm on the amorphous carbon film using TiCl$_4$, the pattern of the amorphous carbon film is etched so that corner portions thereof are rounded. From this result, it can be understood that the amorphous carbon film is damaged when the TiO$_2$ film having a thickness of 15 nm, for example, using TiCl$_4$.

On the other hand, when forming the TiO$_2$ film using TDMAT on the amorphous carbon film, and thereafter forming the TiO$_2$ film using TiCl$_4$ thereon, the amorphous carbon film is hardly etched. From this result, it can be understood that damage to the amorphous carbon film may be reduced by forming the TiO$_2$ film using TDMAT and thereafter forming the TiO$_2$ film using TiCl$_4$. In addition, even when forming a TiO$_2$ film having a thickness of 15 nm on the amorphous carbon film using TDMAT, the amorphous carbon film is hardly etched. However, from the viewpoint of film quality controllability, material costs, and productivity, a TiO$_2$ film may be formed using TDMAT on the amorphous carbon film, and thereafter a TiO$_2$ film may be formed using TiCl$_4$ thereon.

In addition, when the TiO$_2$ film formed using TDMAT has a thickness of 3 nm or 5 nm, a portion of the film is peeled off due to a difference in stress of the TiO$_2$ film having a different metal-containing gas specie. From this result, the thickness of the TiO$_2$ film formed using TDMAT may be 1 nm or less.

Example 2

In Example 2, an effect imparted to an amorphous carbon film when a TiO$_2$ film as a metal oxide film is formed through a PEALD method on the amorphous carbon film as a base film having a predetermined pattern was evaluated by observing a cross-sectional shape of the amorphous carbon film. In addition, in Example 2, the TiO$_2$ film was formed through the PEALD method in the processing container 10 adjusted to 2 Torr (267 Pa). In addition, in the oxidation step, high frequency power of 13.56 MHz was applied from a high frequency power supply in the same manner as in Example 1. In addition, the cross-sectional shape was observed using a STEM.

Figure 7:
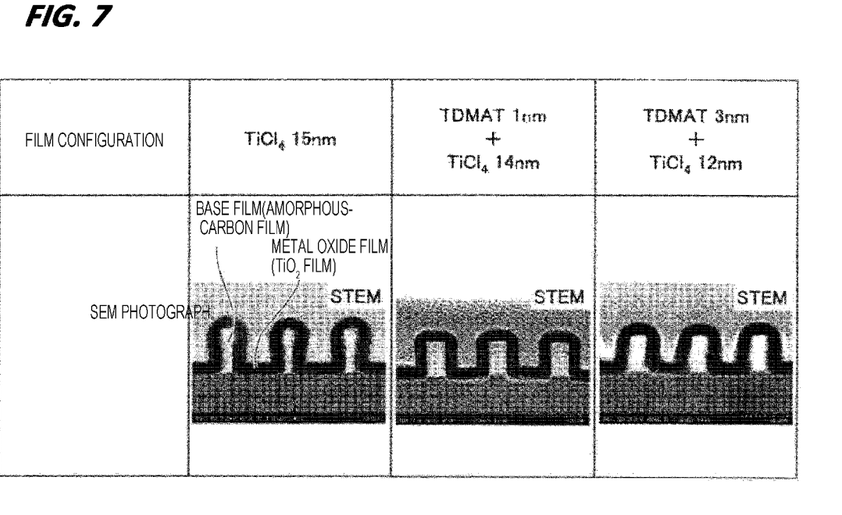
FIG. 7 is a diagram illustrating a cross-sectional shape of a metal oxide film formed by a film forming method in Example 2.

FIG. 7 is a diagram illustrating a cross-sectional shape of a metal oxide film formed by a film forming method in Example 2. The leftmost diagram in FIG. 7 is a STEM photograph when a TiO$_2$ film having a thickness of 15 nm was formed using TiCl$_4$ as a metal-containing gas. The center diagram is a STEM photograph when a TiO$_2$ film having a thickness of 1 nm was formed using TDMAT as a metal-containing gas, and thereafter a TiO$_2$ film having a thickness of 14 nm was formed using TiCl$_4$ as a metal-containing gas. The right diagram is a STEM photograph when a TiO$_2$ film having a thickness of 3 nm was formed using TDMAT as a metal-containing gas, and then a TiO$_2$ film having a thickness of 12 nm was formed using TiCl$_4$ as a metal-containing gas.

As illustrated in FIG. 7, when forming the TiO$_2$ film having a thickness of 15 nm on the amorphous carbon film using TiCl$_4$, the pattern of the amorphous carbon film is etched so that the line width thereof is reduced. From this result, it can be understood that the amorphous carbon film is damaged when the TiO$_2$ film having a thickness of 15 nm, for example, using TiCl$_4$.

On the other hand, when forming the TiO$_2$ film on the amorphous carbon film using TDMAT, and thereafter forming the TiO$_2$ film using TiCl$_4$ thereon, the amorphous carbon film is hardly etched. From this result, it can be understood that damage to the amorphous carbon film may be reduced by forming the TiO$_2$ film using TDMAT and thereafter forming the TiO$_2$ film using TiCl$_4$.

In addition, when the TiO$_2$ film formed using TDMAT has a thickness of 1 nm, peeling is not observed in the TiO$_2$ film. In addition, even when the thickness of the TiO$_2$ film formed using TDMAT is 3 nm, peeling is hardly observed in the TiO$_2$ film. From these results, the thickness of a TiO$_2$ film formed using TDMAT may be preferably 3 nm, and more preferably, may be 1 nm or less.

Second Embodiment (Film Forming Apparatus)

Figure 8:
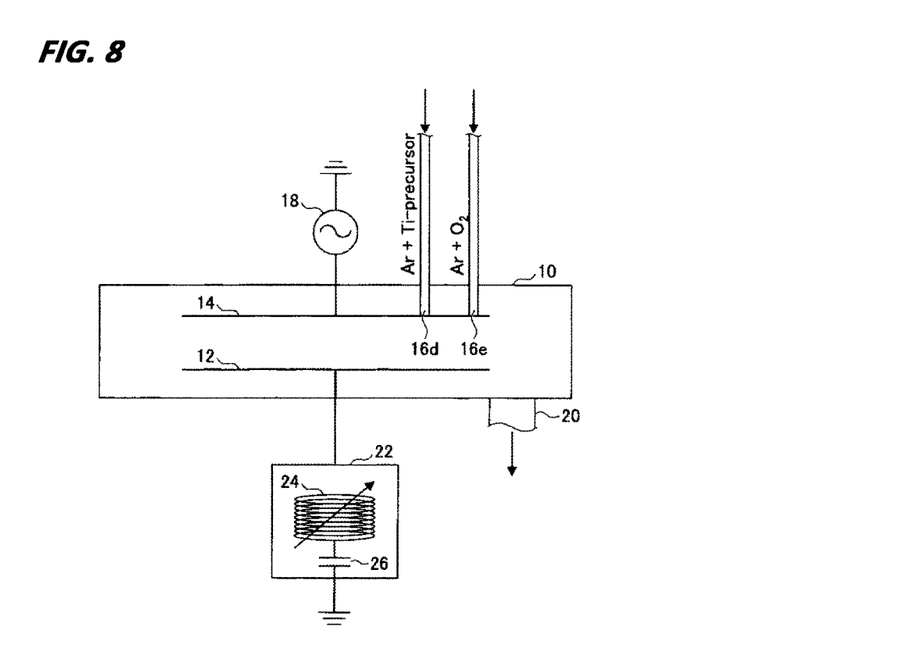
FIG. 8 is a schematic diagram illustrating an exemplary film forming apparatus that carries out a film forming method of a second embodiment.

An exemplary film forming apparatus that carries out a film forming method of a second embodiment will be described. FIG. 8 is a schematic diagram illustrating an exemplary film forming apparatus that carries out a film forming method of a second embodiment.

As illustrated in FIG. 8, the film forming apparatus of the second embodiment is configured as a capacitively coupled (parallel plate type) plasma film forming apparatus. The film forming apparatus includes the substantially cylindrical processing container 10.

The processing container 10 is formed of, for example, aluminum of which the surface is anodized. The processing container 10 is grounded. The placing table 12 is provided inside the processing container 10.

The placing table 12 supports the wafer W as an exemplary workpiece placed thereon. The placing table 12 is grounded via an impedance adjustment circuit 22, and also functions as a lower electrode. The impedance adjustment circuit 22 includes a variable inductor 24 and a capacitor 26 connected to each other in series and is capable of adjusting the impedance between the placing table 12 and a ground by adjusting the variable inductor 24. The shower head 14 is provided above the placing table 12 so as to be opposite parallel to the placing table 12.

The shower head 14 supplies a gas into the processing container 10, and also functions as an upper electrode. A plurality of gas supply units 16d and 16e are connected to the shower head 14. In addition, the high frequency power supply 18 is connected to the shower head 14.

The gas supply unit 16d introduces a metal-containing gas and Ar gas into the shower head 14. The first metal-containing gas is a Ti containing gas (Ti precursor) such as, for example, TDMAT or TiCl$_4$.

The gas supply unit 16e introduces an oxidizing gas and Ar gas into the shower head 14. The oxidizing gas is, for example, O$_2$ gas.

The gas introduced from the gas supply units 16d and 16e into the shower head 14 is discharged into the processing container 10 through a number of gas holes (not illustrated) formed in the lower surface of the shower head 14.

The high frequency power supply 18 is a power supply for exciting plasma, and applies high frequency power to the shower head 14. The frequency of the high frequency power may be set to a frequency suitable for generating plasma in the processing container 10, for example, 380 kHz to 60 MHz.

The exhaust port 20 is provided in the bottom portion of the processing container 10, and exhausts the gas supplied from the shower head 14 into the processing container 10.

When a plasma processing is performed in this film forming apparatus, the wafer W is placed on the placing table 12. In addition, a gas is supplied into the processing container 10 from the plurality of gas supply units 16d and 16e, and the pressure inside the processing container 10 is reduced by the exhaust port 20. Then, the gas supplied into the processing container 10 is excited by the high frequency power applied from the high frequency power supply 18 to the shower head 14. Thus, plasma is generated in the processing container 10, and the wafer W is processed by radicals and/or ions from the plasma.

Meanwhile, a time average potential (plasma potential) of the plasma generated in the processing container 10 is higher than a time average potential of the processing container 10 and a time average potential of the placing table 12. When the time average potential of the placing table 12 is higher than the time average potential of the processing container 10, a potential difference between a time average potential in the vicinity of the wafer W and the plasma potential decreases, and the energy of ions incident on the wafer W decreases. On the other hand, when the time average potential of the placing table 12 is lower than the time average potential of the processing container 10, the potential difference between the time average potential in the vicinity of the wafer W and the plasma potential increases, and the energy of ions incident on the wafer W increases.

In this film forming apparatus, since the impedance between the placing table 12 and the ground may be adjusted by the impedance adjustment circuit 22, the time average potential of the placing table 12 may be controlled. Thus, the time average potential of the placing table 12 may vary relative to the time average potential of the processing container 10, which enables adjustment of the energy of ions incident on the wafer W placed on the placing table 12. For example, when the impedance adjustment circuit 22 sets a high impedance between the placing table 12 and the ground, the time average potential of the placing table 12 becomes higher than the time average potential of the processing container 10. Thus, the energy of ions incident on the wafer W placed on the placing table 12 is reduced.

(Film Forming Method)

Figure 9:
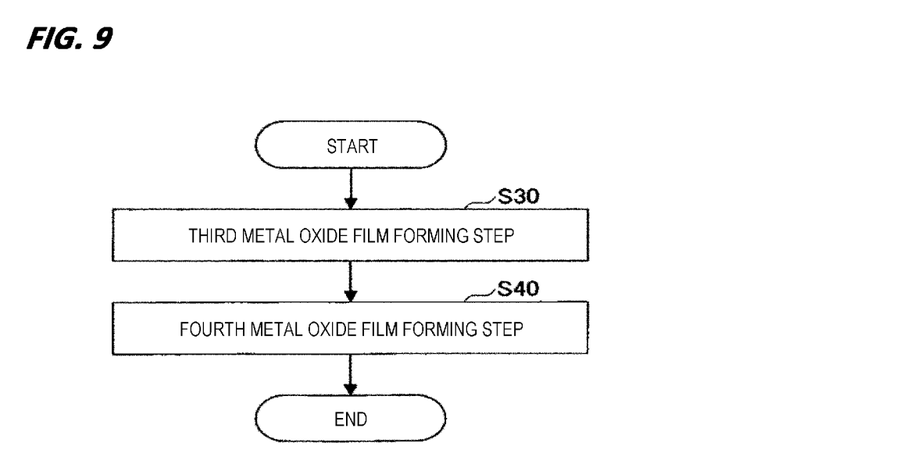
FIG. 9 is a flowchart for explaining the film forming method of the second embodiment.

Next, with respect to the film forming method of the second embodiment, a case where a $TiO_2$ film as an exemplary metal oxide film is formed on a base film having a predetermined pattern formed on the wafer W using the above-described film forming apparatus will be described by way of example. FIG. 9 is a flowchart for explaining the film forming method of the second embodiment.

As illustrated in FIG. 9, the film forming method of the second embodiment includes a third metal oxide film forming step S30 and a fourth metal oxide film forming step S40. The third metal oxide film forming step S30 is a step of forming a third metal oxide film on a base film by alternately supplying a third metal-containing gas having no halogen and a plasmatized oxidizing gas. The fourth metal oxide film forming step S40 is a step of forming a fourth metal oxide film on the third metal oxide film by alternately supplying a fourth metal-containing gas and a plasmatized oxidizing gas.

Figure 10:
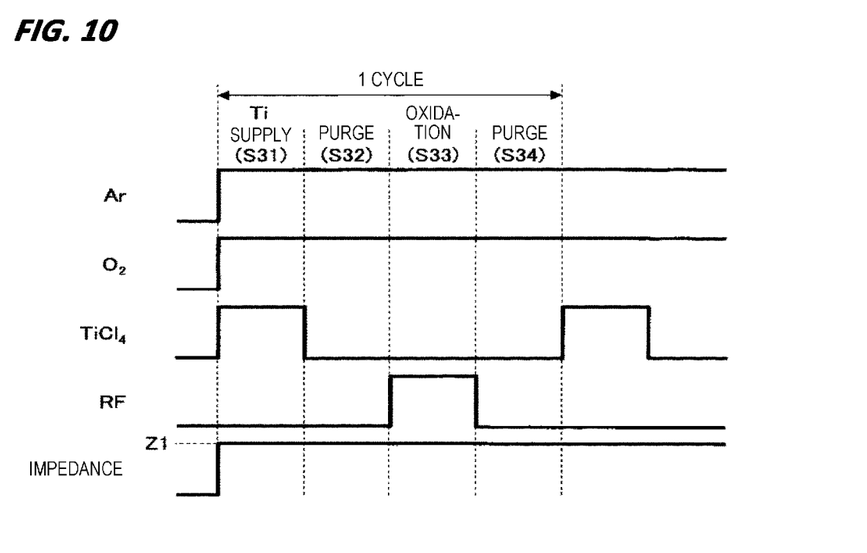
FIG. 10 is a diagram for explaining a third metal oxide film forming step.

FIG. 10 is a diagram for explaining the third metal oxide film forming step S30. As illustrated in FIG. 10, in the third metal oxide film forming step S30, a series of operations including an adsorption step S31, a purge step S32, an oxidation step S33, and a purge step S34 are defined as one cycle, and the number of cycles is controlled to form a $TiO_2$ film having a desired film thickness. In addition, in the third metal oxide film forming step S30, the impedance between the placing table 12 and the ground is adjusted to a first impedance Z1 by adjusting the impedance adjustment circuit 22.

The adsorption step S31 is a step of supplying the metal-containing gas into the processing container 10 and adsorbing the metal-containing gas on the base film in a state where the impedance between the placing table 12 and the ground is adjusted to the first impedance Z1. In the adsorption step S31, $TiCl_4$ as an example of the metal-containing gas and Ar gas are supplied from the gas supply unit 16d into the processing container 10, and $O_2$ gas and Ar gas are supplied from the gas supply unit 16e. Thus, the $TiCl_4$ is adsorbed on the base film. The adsorption step S31 may be set to, for example, 0.05 seconds to 0.5 seconds.

The purge step S32 is a step of purging the excessive metal-containing gas in the processing container 10. In the purge step S32, the supply of $TiCl_4$ from the gas supply unit 16d is stopped while the supply of $O_2$ gas and Ar gas from the gas supply unit 16e is continued. Thus, for example, the excessive $TiCl_4$ in the processing container 10 is purged. The purge step S32 may be set to, for example, 0.3 seconds to 1.0 second.

The oxidation step S33 is a step of supplying the oxidizing gas into the processing container 10 and oxidizing the $TiCl_4$ adsorbed on the base film. In the oxidation step S33, high frequency power (e.g., 450 kHz) is applied to the shower head 14 by the high frequency power supply 18 while the supply of $O_2$ gas and Ar gas from the gas supply unit 16e is continued. Thus, plasma of $O_2$ gas and Ar gas is generated, and the $TiCl_4$ adsorbed on the base film is oxidized. The oxidation step S33 may be set to, for example, 0.3 seconds to 1.0 second.

The purge step S34 is a step of purging the excessive plasmatized $O_2$ gas and Ar gas, for example, in the processing container 10. In the purge step S34, the high frequency power applied to the shower head 14 from the high frequency power supply 18 is interrupted while the supply of $O_2$ gas and Ar gas from the gas supply unit 16e is continued. Thus, the excessive plasmatized $O_2$ gas and Ar gas in the processing container 10 are purged. The purge step S34 may be set to, for example, 0.1 seconds to 1.0 second.

In this manner, by defining a series of operations including the adsorption step S31, the purge step S32, the oxidation step S33, and the purge step S34 as one cycle, and controlling the number of cycles, a $TiO_2$ film having a desired film thickness (e.g., 1 nm) may be formed.

Figure 11:
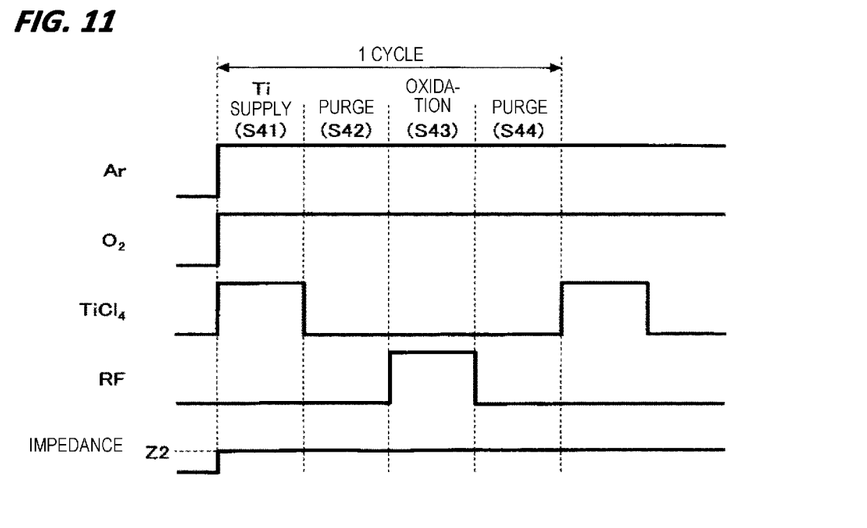
FIG. 11 is a diagram for explaining a fourth metal oxide film forming step.

FIG. 11 is a diagram for explaining the fourth metal oxide film forming step S40. As illustrated in FIG. 11, in the fourth metal oxide film forming step S40, a series of operations including an adsorption step S41, a purge step S42, an oxidation step S43, and a purge step S44 are defined as one cycle, and the number of cycles is controlled so as to form a $TiO_2$ film having a desired film thickness. In addition, in the fourth metal oxide film forming step S40, the impedance between the placing table 12 and the ground is adjusted to a second impedance Z2 lower than the first impedance Z1 by adjusting the impedance adjustment circuit 22.

The adsorption step S41 is a step of supplying the metal-containing gas into the processing container 10 and adsorbing the metal-containing gas on the third metal oxide film. In the adsorption step S41, $TiCl_4$ as an example of the metal-containing gas and Ar gas are supplied from the gas supply unit 16d into the processing container 10, and $O_2$ gas and Ar gas are supplied from the gas supply unit 16e. Thus, the $TiCl_4$ is adsorbed on the $TiO_2$ film as the third metal oxide film. The adsorption step S41 may be set to, for example, 0.05 seconds to 0.5 seconds.

The purge step S42 is a step of purging the excessive fourth metal-containing gas in the processing container 10. In the purge step S42, the supply of $TiCl_4$ from the gas supply unit 16d is stopped while the supply of $O_2$ gas and Ar gas from the gas supply unit 16e is continued. Thus, for example, the excessive TiCl$_4$ in the processing container 10 is purged. The purge step S42 may be set to, for example, 0.3 seconds to 1.0 second.

The oxidation step S43 is a step of supplying the oxidizing gas into the processing container 10 and oxidizing the TiCl$_4$ adsorbed on the third metal oxide film. In the oxidation step S43, high frequency power (e.g., 450 kHz) is applied to the shower head 14 by the high frequency power supply 18 while the supply of O$_2$ gas and Ar gas from the gas supply unit 16e is continued. Thus, plasma of O$_2$ gas and Ar gas is generated, and the TiCl$_4$ adsorbed on the third metal oxide film is oxidized. The oxidation step S43 may be set to, for example, 0.3 seconds to 1.0 second.

The purge step S44 is a step of purging, for example, the excessive plasmatized O$_2$ gas and Ar gas in the processing container 10. In the purge step S44, the high frequency power applied to the shower head 14 from the high frequency power supply 18 is interrupted while the supply of O$_2$ gas and Ar gas from the gas supply unit 16e is continued. Thus, the excessive plasmatized O$_2$ gas and Ar gas in the processing container 10 are purged. The purge step S44 may be set to, for example, 0.1 seconds to 1.0 second.

In this manner, by defining a series of operations including the adsorption step S41, the purge step S42, the oxidation step S43, and the purge step S44 as one cycle, and controlling the number of cycles, a TiO$_2$ film having a desired film thickness (e.g., 14 nm) may be formed.

Figure 12:
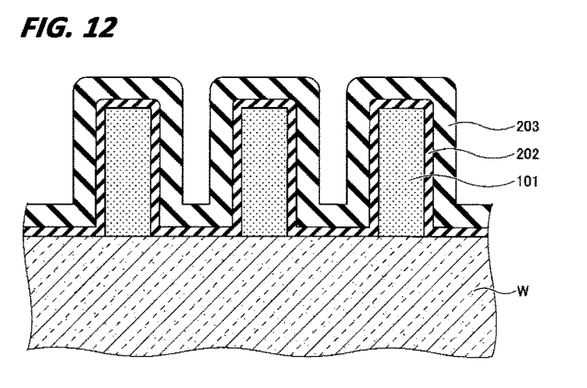
FIG. 12 is a schematic cross-sectional view of a metal oxide film formed by the film forming method illustrated in FIG. 9.

FIG. 12 is a schematic cross-sectional view of a metal oxide film formed by the film forming method illustrated in FIG. 9. As illustrated in FIG. 12, according to the film forming method of the second embodiment, by the third metal oxide film forming step S30, a TiO$_2$ film 202 as the third metal oxide film is formed so as to cover the base film 101 having a predetermined pattern formed on the wafer W. In addition, by the fourth metal oxide film forming step S40, a TiO$_2$ film 203 as the fourth metal oxide film is formed so as to cover the TiO$_2$ film 202.

As described above, according to the film forming method of the second embodiment, first, a TiO$_2$ film is formed on an amorphous carbon film in a state where the impedance adjustment circuit 22 sets a high impedance between the placing table 12 and the ground. Subsequently, a TiO$_2$ film is formed in a state where the impedance adjustment circuit 22 sets a low impedance between the placing table 12 and the ground. This makes it possible to reduce the energy of ions incident on the amorphous carbon film at the initial stage of film formation in which the surface of the amorphous carbon film is exposed. As a result, ion shocks on the surface of the amorphous carbon film may be prevented. That is, damage to the amorphous carbon film may be reduced.

In addition, while the TiO$_2$ film is formed, the surface of the amorphous carbon film is already covered with another TiO$_2$ film. Therefore, even if the energy of ions incident on the amorphous carbon film increases, the TiO$_2$ film formed at the initial stage functions as a protective film against ions incident on the amorphous carbon film, which prevents the surface of the amorphous carbon film from being roughened. Thus, it is possible to select various conditions including a condition under which the energy of ions incident on the amorphous carbon film increases during film formation. As a result, it is possible to easily form a metal oxide film having a desired film quality (e.g., film density, wet etching rate, or dry etching rate). That is, high film quality controllability is obtained.

Example 3

In Example 3, an effect imparted to an amorphous carbon film when a TiO$_2$ film as a metal oxide film is formed through a PEALD method on the amorphous carbon film as a base film having a predetermined pattern was evaluated by observing a cross-sectional shape of the amorphous carbon film. In addition, in Example 3, the TiO$_2$ film was formed through the PEALD method in a state where the impedance between the placing table 12 and the ground is adjusted to 0Ω or 292Ω. In addition, in the oxidation step, high frequency power of 450 kHz was applied from a high frequency power supply. In addition, the cross-sectional shape was observed using a STEM.

Figure 13:
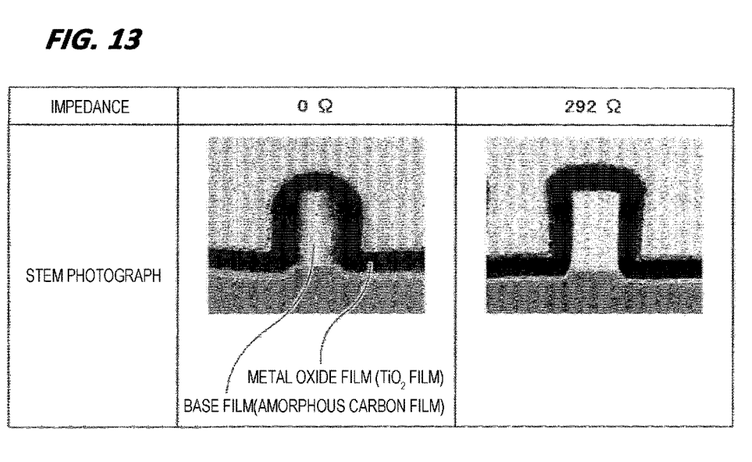
FIG. 13 is a diagram illustrating a cross-sectional shape of a metal oxide film formed by a film formation method in Example 3.

FIG. 13 is a diagram illustrating a cross-sectional shape of a metal oxide film formed by a film forming method in Example 3. The left diagram in FIG. 13 is a STEM photograph when a TiO$_2$ film was formed on an amorphous carbon film in a state where the impedance between the placing table 12 and the ground is adjusted to 0Ω. The right diagram in FIG. 13 is a STEM photograph when a TiO$_2$ was film formed on an amorphous carbon film in a state where the impedance between the placing table 12 and the ground is adjusted to 292Ω.

As illustrated in FIG. 13, when the TiO$_2$ film is formed on the amorphous carbon film in the state where the impedance between the placing table 12 and the ground is adjusted to 0Ω, a pattern of the amorphous carbon film is etched so that the line width is reduced. From this result, it can be understood that the amorphous carbon film is damaged when the TiO$_2$ film is formed on the amorphous carbon film in the state where the impedance between the placing table 12 and the ground is adjusted to 0Ω.

On the other hand, when forming the TiO$_2$ film on the amorphous carbon film in a state where the impedance between the placing table 12 and ground is adjusted to 292Ω, the amorphous carbon film is hardly etched. From this result, it can be understood that damage to the amorphous carbon film may be reduced by forming the TiO$_2$ film on the amorphous carbon film in the state where the impedance between the placing table 12 and the ground is adjusted to 292Ω.

In the second embodiment, a case where the same metal-containing gas is used in the third metal oxide film forming step S30 and the fourth metal oxide film forming step S40 has been described above by way of example, but the present disclosure is not limited thereto. For example, it is possible to use different metal containing gas in the third metal oxide film forming step S30 from that in the fourth metal oxide film forming step S40 as in the first embodiment.

In the above embodiments, a semiconductor wafer has been described as an example of a workpiece, but the semiconductor wafer may be a silicon wafer or a compound semiconductor wafer such as, for example, GaAs, SiC, or GaN. In addition, the workpiece is not limited to the semiconductor wafer, and may be, for example, a glass substrate or a ceramic substrate for use in a flat panel display (FPD) such as, for example, a liquid crystal display device.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming method comprising:
    forming a first metal oxide film on a base film during a first period of time by alternately supplying a first metal-containing gas and a plasmatized oxidizing gas to the base film; and
    forming a second metal oxide film on the first metal oxide film during a second period of time by alternately supplying a second metal-containing gas and the plasmatized oxidizing gas to the first metal oxide film,
    wherein the first metal-containing gas does not include halogen and the second metal-containing gas is different from the first metal-containing gas, and
    wherein the first metal-containing gas and the second metal-containing gas contain a same metal element.

2. The film forming method of claim 1, wherein the metal oxide film formed using the first metal-containing gas has a thickness of 1 nm or less.

3. The film forming method of claim 1, wherein the second metal-containing gas includes the halogen.

4. The film forming method of claim 3, wherein the halogen is chlorine.

5. The film forming method of claim 1, wherein the first metal-containing gas is tetrakis(dimethylamino)titanium (TDMAT).

6. The film forming method of claim 1, wherein the second metal-containing gas is TiCl4.

7. The film forming method of claim 1, wherein the base film is an amorphous carbon film having a predetermined pattern.

8. A film forming method comprising:
    forming a metal oxide film on a workpiece using a film forming apparatus including a placing table on which the workpiece is placed and an impedance adjustment circuit provided to adjust an impedance between the placing table and a ground,
    wherein the metal oxide film is formed by:
    forming a first metal oxide film on the workpiece during a first period of time by alternately supplying a first metal-containing gas and a plasmatized oxidizing gas to the workpiece; and
    forming a second metal oxide film on the first metal oxide film during a second period of time by alternately supplying a second metal-containing gas and the plasmatized oxidizing gas to the first metal oxide film,
    wherein the impedance adjustment circuit is adjusted such that the impedance changes from a first impedance to a second impedance lower than the first impedance during the film forming of the metal oxide film, and
    wherein the first metal-containing gas and the second metal-containing gas contain a same metal element.

* * * * *